United States Patent
Cheng et al.

(10) Patent No.: US 9,835,922 B2
(45) Date of Patent: Dec. 5, 2017

(54) ARRAY SUBSTRATE AND LIQUID CRYSTAL DISPLAY DEVICE

(71) Applicant: BOE TECHNOLOGY GROUP CO., LTD, Beijing (CN)

(72) Inventors: Hongfei Cheng, Beijing (CN); Jianbo Xian, Beijing (CN); Yong Qiao, Beijing (CN); Yongchun Lu, Beijing (CN); Yongda Ma, Beijing (CN); Jian Xu, Beijing (CN); Wenbo Li, Beijing (CN); Pan Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 138 days.

(21) Appl. No.: 14/771,428

(22) PCT Filed: Mar. 27, 2015

(86) PCT No.: PCT/CN2015/075252
§ 371 (c)(1),
(2) Date: Aug. 28, 2015

(87) PCT Pub. No.: WO2016/054897
PCT Pub. Date: Apr. 14, 2016

(65) Prior Publication Data
US 2016/0291367 A1    Oct. 6, 2016

(30) Foreign Application Priority Data

Oct. 10, 2014  (CN) .................... 2014 2 0585072 U (51) Int. Cl.
*G02F 1/1362* (2006.01)
*G02F 1/1343* (2006.01)
(Continued)

(52) U.S. Cl.
CPC ........ *G02F 1/1368* (2013.01); *G02F 1/13624* (2013.01); *G02F 1/133514* (2013.01);
(Continued)

(58) Field of Classification Search
CPC ........... G02F 1/13624; G02F 1/136213; G02F 2001/134345; G02F 1/1368
See application file for complete search history.

(56) References Cited

U.S. PATENT DOCUMENTS

2009/0027581 A1    1/2009  You et al.
2012/0105785 A1*   5/2012  Kim .................... G09G 3/3648
                                                         349/139
(Continued)

FOREIGN PATENT DOCUMENTS

CN    102879962 A    1/2013
CN    103472636 A    12/2013
(Continued)

OTHER PUBLICATIONS

International Search Report of PCT/CN2015/075252 in Chinese, dated Jun. 26, 2015 with English translation.
(Continued)

*Primary Examiner* — Jia Pan
(74) *Attorney, Agent, or Firm* — Collard & Roe, P.C.

(57) ABSTRACT

An array substrate and a liquid crystal display device are provided. The array substrate comprises a plurality of columns of pixel units defined by adjacent data lines; each column of pixel units includes a plurality of pixel units, each pixel unit includes a first subpixel electrode, a second subpixel electrode, a first thin film transistor, a second thin film transistor and a third thin film transistor; each pixel unit further includes: a gate line arranged between the first subpixel electrode and the second subpixel electrode; the gate line being electrically connected with a gate electrode
(Continued)

of the first thin film transistor, a gate electrode of the second thin film transistor and a gate electrode of the third thin film transistor respectively.

15 Claims, 6 Drawing Sheets

(51) Int. Cl.
    *G02F 1/1368*      (2006.01)
    *G02F 1/1335*      (2006.01)
    *H01L 27/02*      (2006.01)
    *H01L 27/12*      (2006.01)

(52) U.S. Cl.
    CPC .. *G02F 1/134336* (2013.01); *G02F 1/136213* (2013.01); *H01L 27/0207* (2013.01); *H01L 27/124* (2013.01); *H01L 27/1255* (2013.01); *H01L 27/1259* (2013.01); *G02F 2001/134345* (2013.01)

(56) References Cited

U.S. PATENT DOCUMENTS

| | | | | |
|---|---|---|---|---|
| 2012/0224128 A1* | 9/2012 | Jung | ................ | G02F 1/134309 349/129 |
| 2013/0057813 A1* | 3/2013 | Jeong | ................ | G02F 1/134309 349/110 |
| 2013/0077002 A1* | 3/2013 | Yoon | ................ | G02F 1/136213 349/38 |
| 2013/0093658 A1* | 4/2013 | Park | ................ | G02F 1/13452 345/92 |
| 2013/0215341 A1* | 8/2013 | Rho | ................ | G02F 1/134309 349/15 |
| 2014/0098315 A1* | 4/2014 | Jung | ................ | G02F 1/136209 349/42 |
| 2015/0042914 A1* | 2/2015 | Cho | ................ | G02F 1/136286 349/43 |
| 2015/0070336 A1 | 3/2015 | Qu et al. | | |
| 2015/0092134 A1 | 4/2015 | Jiang et al. | | |
| 2015/0268517 A1* | 9/2015 | Song | ................ | G02F 1/134309 349/43 |
| 2016/0131951 A1* | 5/2016 | Lee | ................ | G02F 1/13624 349/39 |

FOREIGN PATENT DOCUMENTS

| | | |
|---|---|---|
| CN | 103472647 A | 12/2013 |
| CN | 203366281 U | 12/2013 |
| CN | 204065625 U | 12/2014 |

OTHER PUBLICATIONS

Notice of Transmittal of the International Search Report of PCT/CN2015/075252 in Chinese, dated Jun. 26, 2015.

Written Opinion of the International Searching Authority of PCT/CN2015/075252 in Chinese, dated Jun. 26, 2015 with English translation.

* cited by examiner

ARRAY SUBSTRATE AND LIQUID CRYSTAL DISPLAY DEVICE

CROSS REFERENCE TO RELATED APPLICATIONS

This application is the National Stage of PCT/CN2015/075252 filed on Mar. 27, 2015, which claims priority under 35 U.S.C. §119 of Chinese Application No. 201420585072.2 filed on Oct. 10, 2014, the disclosure of which is incorporated by reference.

TECHNICAL FIELD

Embodiments of the disclosure relate to an array substrate and a liquid crystal display device.

BACKGROUND

A liquid crystal display technology is a display technology which is most broadly used at present, and is mainly applied to a television, a cellphone and a public information display device.

Modes of liquid crystal display can be divided into a Twisted Nematic (TN) mode, a Vertical-Alignment (VA) mode and an In-Plane Switching (IPS) mode. Wherein, a liquid crystal display device of VA mode can realize eight domains liquid crystal alignment in one pixel unit, so that a wider viewing angle is obtained, and an image displayed and output by the liquid crystal display device has higher contrast than the image displayed and output by another liquid crystal display device. Therefore, the liquid crystal display technology of the VA mode is widely applied to large-sized liquid crystal display devices. However, the eight domains liquid crystal alignment is usually realized in a charge sharing manner. In such a charge sharing manner, two adjacent gate lines are used in one pixel unit, which is relatively complex for wiring of an array substrate, and an aperture ratio of the pixel unit is relatively low.

To sum up, the liquid crystal display device of VA mode realizes the eight domains liquid crystal alignment in one pixel unit in the charge sharing manner, so two gates lines will be used; moreover, this manner is relatively complex, and the aperture ratio of the pixel unit is relatively low.

SUMMARY

Embodiments of the disclosure provide an array substrate and a liquid crystal display device, which are applied in a liquid crystal display device in a VA mode, and can realize charging subpixel electrodes in a same pixel unit by using only one gate line, so as to simply the array substrate, and improve the aperture ratio of the pixel unit. Besides, adjacent subpixel electrodes in the same pixel unit may have different voltages, so the liquid crystal display device has a wider viewing angle.

At least one embodiment of the disclosure provides an array substrate, which is applied to a liquid crystal display device in a VA mode, the array substrate comprising a plurality of columns of pixel units defined by adjacent data lines, each column of pixel units including a plurality of pixel units, each pixel unit including subpixel electrodes, common electrode lines and thin film transistors, wherein, the subpixel electrodes include a first subpixel electrode and a second subpixel electrode, the common electrode lines include a first common electrode line and a second common electrode line, and the thin film transistors include a first thin film transistor, a second thin film transistor and a third thin film transistor, each pixel unit further includes:

a gate line arranged between the first subpixel electrode and the second subpixel electrode;

the gate line is electrically connected with a gate electrode of the first thin film transistor, a gate electrode of the second thin film transistor and a gate electrode of the third thin film transistor respectively.

For example, the gate line being electrically connected with a gate electrode of the first thin film transistor, a gate electrode of the second thin film transistor and a gate electrode of the third thin film transistor, respectively, includes:

The gate electrode of the first thin film transistor is a first protruding portion of the gate line, the gate electrode of the second thin film transistor is a second protruding portion of the gate line, and the gate electrode of the third thin film transistor is a portion of the gate line.

For example, a source electrode of the first thin film transistor and a source electrode of the second thin film transistor are both electrically connected with one of adjacent data lines defining the column of pixel units, and a source electrode of the third thin film transistor is electrically connected with the first subpixel electrode;

A drain electrode of the first thin film transistor is electrically connected with the first subpixel electrode, a drain electrode of the second thin film transistor is electrically connected with the second subpixel electrode, and a drain electrode of the third thin film transistors is electrically connected with the second common electrode line or the first common electrode line.

For example, the source electrode of the second thin film transistor is connected with the data line through the source electrode of the first thin film transistor.

For example, the drain electrode of the first thin film transistors is connected with the first subpixel electrode through a first via hole, the drain electrode of the second thin film transistor is electrically connected with the second subpixel electrode through a second via hole, and the source electrode of the third thin film transistor is connected with the first subpixel electrode through a third via hole.

For example, the first common electrode line and the second common electrode line are positioned on two sides of the gate line respectively, the first common electrode line is close to the first subpixel electrode and the second common electrode line is close to the second subpixel electrode.

For example, both of the first common electrode line and the second common electrode line include portions parallel with the gate line, and portions parallel with the data line.

The first common electrode line and the first subpixel electrode partially or totally overlap, and a first storage capacitor is formed by an overlapping portion of the first common electrode line and the first subpixel electrode; the second common electrode line and the second subpixel electrode partially or totally overlap, and a second storage capacitor is formed by an overlapping portion of the second common electrode line and the second first subpixel electrode.

For example, the first common electrode line and/or the second common electrode line further include(s) protruding portions.

For example, the drain electrode of the third thin film transistor is connected with the protruding portion of the second common electrode line through a fourth via hole, and is further connected with the second common electrode line.

For example, each of the first subpixel electrode and the second subpixel electrode includes: root parallel with the gate line, root parallel with the data line, branch portions and slits corresponding to the branch portions.

For example, a channel width to length ratio of the third thin film transistor is less than that of the first thin film transistor.

For example, a channel width to length ratio of the second thin film transistor is equal to that of the first thin film transistor.

For example, an area of the first subpixel electrode is greater than or equal to that of the second subpixel electrode.

For example, a maximum value of the area of the first subpixel electrode is 1.5 times that of the second subpixel electrode.

An embodiment of the disclosure further provides a liquid crystal display device, comprising an array substrate, an opposed substrate and a liquid crystal layer positioned between the array substrate and the opposed substrate, and the array substrate is any substrate described above.

For example, the opposed substrate is a color filter substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, technical terms or scientific terms used herein have normal meanings understood by those of ordinary skill in the art of the disclosure. Words such as "first" and "second" and the like used in the disclosure do not mean any sequence, quantity or importance, and are only used for differentiating different constituent parts.

It should be explained that for example, for a transistor in the field of liquid crystal display, a source electrode and a drain electrode have no clear difference. Therefore, in the embodiment of the disclosure, a source electrode of a transistor mentioned can be a drain electrode of the transistor, and the drain electrode of the transistor can be the source electrode of the transistor, according to needs.

At least one embodiment of the disclosure provides an array substrate and a liquid crystal display device, wherein subpixel electrodes in a same pixel unit are charged by using only one gate line, so as to simply the array substrate and improve an aperture ratio of the pixel unit.

An embodiment of the disclosure provides an array substrate, which is applied to a liquid crystal display device in a VA mode; the array substrate comprises a plurality of columns of pixel units defined by adjacent data lines, each column of pixel units including a plurality of pixel units, each pixel unit including subpixel electrodes, common electrode lines and thin film transistors, wherein, the subpixel electrodes include a first subpixel electrode and a second subpixel electrode, the common electrode lines include a first common electrode line and a second common electrode line, and the thin film transistors include a first thin film transistor, a second thin film transistor and a third thin film transistor, each pixel unit further includes:

a gate line arranged between the first subpixel electrode and the second subpixel electrode;

The gate line is electrically connected with a gate electrode of the first thin film transistor, a gate electrode of the second thin film transistor and a gate electrode of the third thin film transistor respectively.

For example, the gate line being electrically connected with a gate electrode of the first thin film transistor, a gate electrode of the second thin film transistor and a gate electrode of the third thin film transistor respectively, includes:

The gate electrode of the first thin film transistor can be a first protruding portion of the gate line, the gate electrode of the second thin film transistor can be a second protruding portion of the gate line, and the gate electrode of the third thin film transistor can be a portion of the gate line. For example, a source electrode of the first thin film transistor is electrically connected with one of the adjacent data lines defining the column of pixel units, and a source electrode of the second thin film transistor is also electrically connected with the data line, and a source electrode of the third thin film transistor is electrically connected with the first subpixel electrode;

A drain electrode of the first thin film transistor is electrically connected with the first subpixel electrode, a drain electrode of the second thin film transistor is electrically connected with the second subpixel electrode, and a drain electrode of the third thin film transistor is electrically connected with the second common electrode line or the first common electrode line.

Similarly, the source electrode of the third thin film transistor can also be electrically connected with the second subpixel electrode; and, the drain electrode of the third thin film transistor can also be electrically connected with the second common electrode line or the first common electrode line, which is not particular defined herein.

For example, the first common electrode line and the second common electrode line are positioned on two sides of the gate line respectively, the first common electrode line is close to the first subpixel electrode and the second common electrode line is close to the second subpixel electrode.

For example, each common electrode line includes: a portion parallel with the gate line and a portion parallel with the data line;

The first common electrode line and the first subpixel electrode partially or totally overlap, and a first storage capacitor is formed by an overlapping portion of the first common electrode line and the first subpixel electrode; the second common electrode line and the second subpixel electrode partially or totally overlap, and a second storage capacitor is formed by an overlapping portion of the second common electrode line and the second first subpixel electrode.

For example, each subpixel electrode includes: a root parallel with the gate line, a root parallel with the data line, branch portions and a slits corresponding to the branch portions.

For example, the third thin film transistor has a channel width to length ratio less than that of the first thin film transistor.

For example, the second thin film transistor has a channel width to length ratio equal to that of the first thin film transistor.

For example, the first subpixel electrode has an area greater than or equal to that of the second subpixel electrode.

For example, a maximum value of the area of the first subpixel electrode is 1.5 times that of the second subpixel electrode.

In the same one pixel unit, the gate line arranged between the first subpixel electrode and the second subpixel electrode is electrically connected with the gate electrode of the first thin film transistor, the gate electrode of the second thin film transistor and the gate electrode of the third thin film transistor, so that the first subpixel electrode and the second subpixel are charged at the same time; Furthermore, as only one gate line is used, the wiring of the array substrate can be simplified, and the aperture ratio of the pixel unit is improved.

The array substrate provided by embodiments of the disclosure is explained and described in combination with the drawings.

Figure 1:
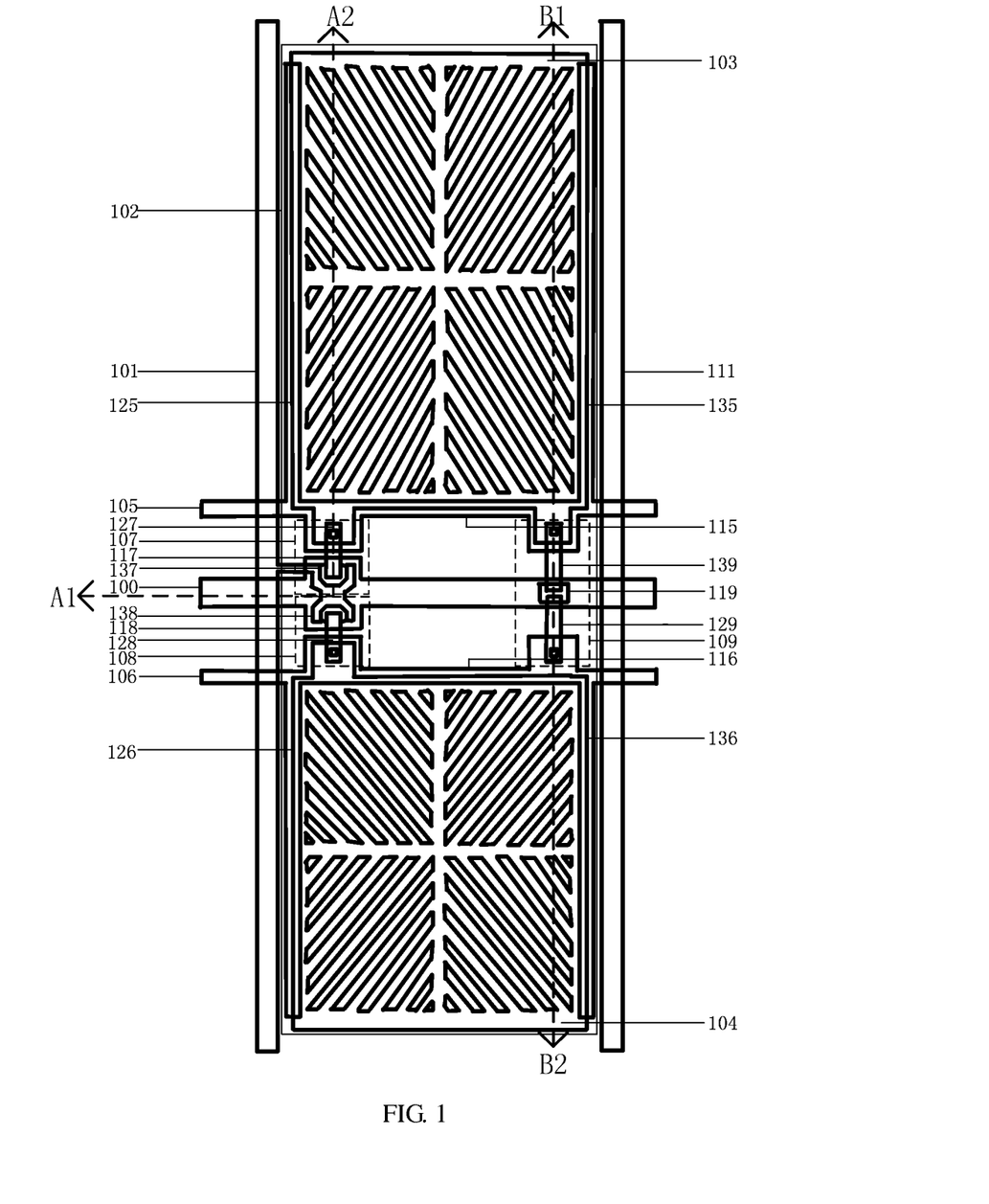
FIG. 1 is a plan view of pixel units of an array substrate provided by an embodiment of the disclosure.

With reference to FIG. 1, an embodiment of the disclosure provides an array substrate, comprising a pixel unit 102 defined by adjacent data line 101 and data line 111; the pixel unit 102 includes a gate line 100, a first subpixel electrode 103, a second subpixel electrode 104, a first common electrode line 105, a second common electrode line 106, a first thin film transistor 107, a second thin film transistor 108 and a third thin film transistor 109.

Figure 2:
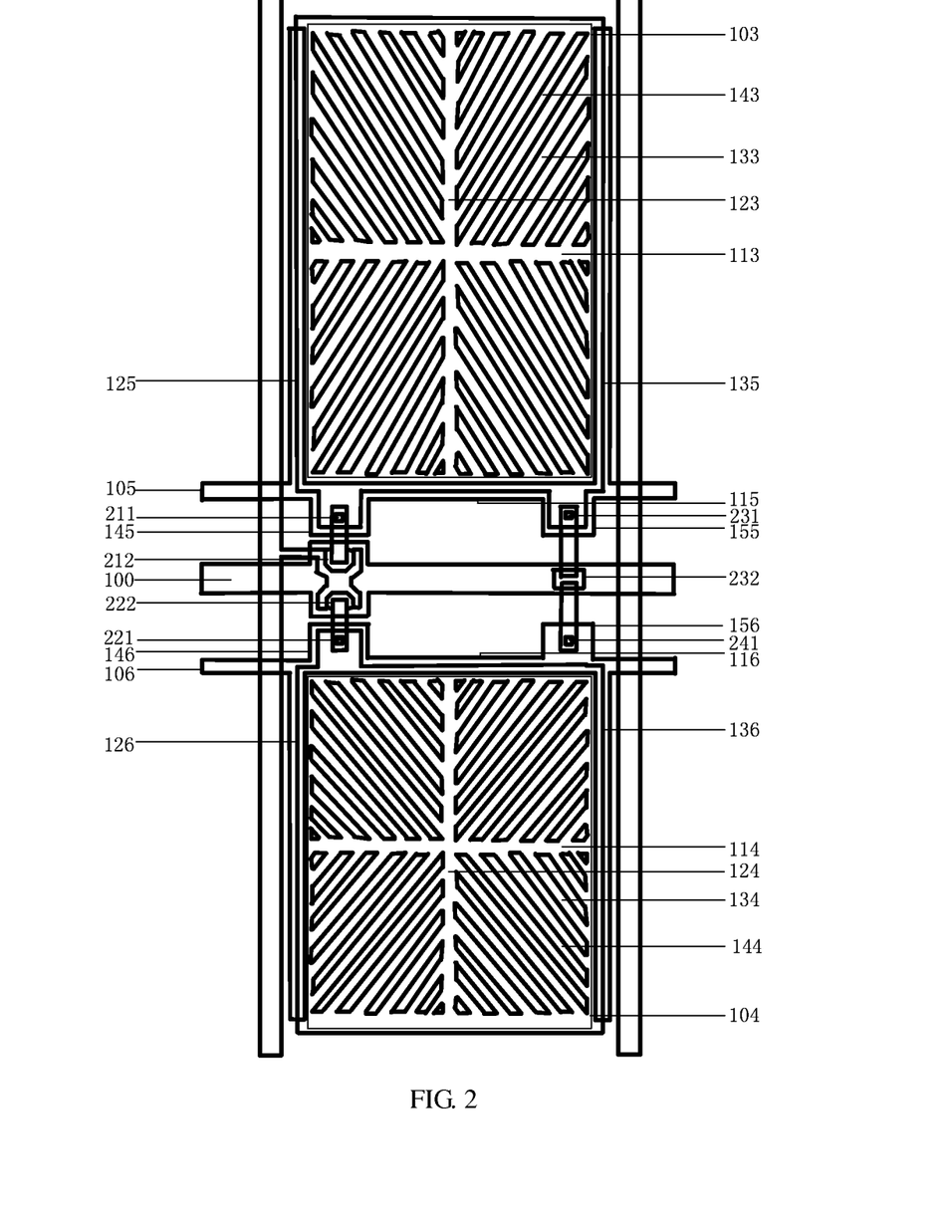
FIG. 2 is a plan view of via holes and an active layer of the array substrate provided by the embodiment of the disclosure.

With reference to FIG. 2, the array substrate further comprises a first via hole 211, a second via hole 221, a third via hole 231, a fourth via hole 241, a first active layer 212, a second active layer 222 and a third active layers 232, wherein, The gate line 100 is positioned between the first subpixel electrode 103 and the second subpixel electrode 104.

With reference to FIG. 2, the first subpixel electrode 103 includes a root 113 parallel with the gate line, a root 123 parallel with the data line, branch portions 133 and a slits 143 corresponding to the branch portions;

The second subpixel electrode 104 includes a root 114 parallel with the gate line, a root 124 parallel with the data line, branch portions 134 and slits 144 corresponding to the branch portion;

The first common electrode line 105 and the second common electrode line 106 are positioned on two sides of the gate line 100 respectively; the first common electrode line 105 is close to the first subpixel electrode 103, and the second common electrode line 106 is close to the second subpixel electrode 104;

The first common electrode line 105 includes a portion 115 parallel with the gate line 100, portions 125 and 135 parallel with the data line 101 and protruding portions 145 and 155;

The second common electrode line 106 includes a portion 116 parallel with the gate line 100, portions 126 and 136 parallel with the data line 101 and protruding portions 146 and 156;

Wherein, the portion 115 of the first common electrode line parallel with the gate line and the portions 125 and 135 of the first common electrode line parallel with the data line are partially or totally overlapped with the first subpixel electrode, and a first storage capacitor CSTa is formed by the overlapping portion; the portion 116 of the second common electrode line parallel with the gate line and the portions 126 and 136 of the second common electrode line parallel with the data line are partially or totally overlapped with the second subpixel electrode, and a second storage capacitor CSTb is formed by the overlapping portion.

With reference to FIG. 1 and FIG. 2, the first thin film transistor 107 includes a gate electrode, and a drain electrode 127 and a source electrode 137, wherein, the gate electrode of the first thin film transistor 107 can be a first protruding portion 117 of the gate line 100; the drain electrode 127 of the first thin film transistor 107 is connected with the first subpixel electrode 103 through a first via hole 211, and the source electrode 137 of the first thin film transistor 107 is connected with the data line 101;

The second thin film transistor 108 includes a gate electrode, a drain electrode 128 and a source electrode 138, wherein, the gate electrode of the second thin film transistor 108 can be a second protruding portion 118 of the gate line 100; the drain electrode 128 of the second thin film transistor 108 is connected with the second subpixel electrode 104 through a second via hole 221, and the source electrode 138 of the second thin film transistor 108 is connected with the data line 101 through the source electrode 137 of the first thin film transistor 107;

The third thin film transistor 109 includes a gate electrode, a drain electrode 129 and a source electrode 139, wherein, the gate electrode 119 of the third thin film transistors 109 can be a portion of the gate line 100, the drain electrode 129 of the third thin film transistor 109 is connected with the protruding portion 156 of the second common electrode line through the fourth via hole 241 and are further connected with the second common electrode line 106, and the source electrode 139 of the third thin film transistor 109 is connected with the first subpixel electrode 103 through the third via hole 231.

Wherein, the drain electrode 129 of the third thin film transistor 109 can also be connected with the first common electrode line 105.

Figure 3A:
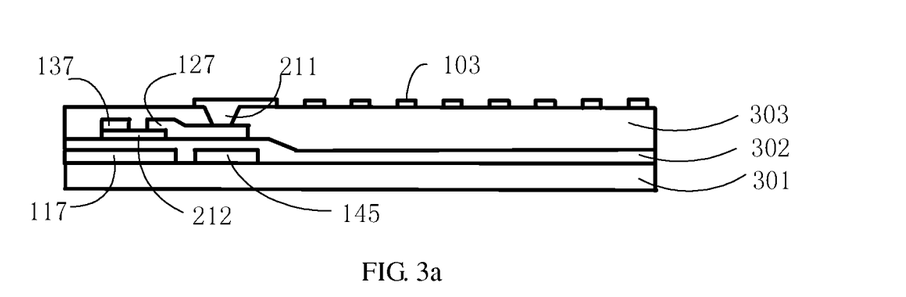
FIG. 3a is a sectional view of the array substrate along A1-A2 direction as shown in FIG. 1.
Figure 3B:
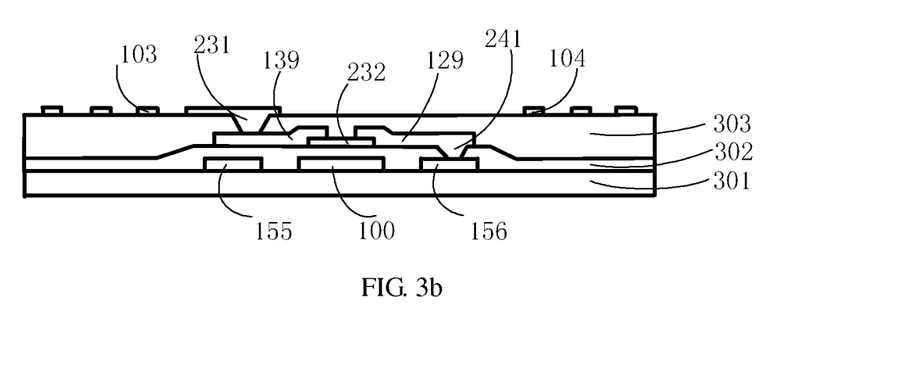
FIG. 3b is a sectional view of the array substrate along B1-B2 direction as shown in FIG. 1.

With reference to FIG. 3a and FIG. 3b, the array substrate provided by the embodiment of the disclosure further comprises a first base substrate 301, a gate insulating layer 302 and a passivation layer 303.

A manufacturing method for the array substrate provided by the embodiment of the disclosure is described from an aspect of process flow.

Figure 4:
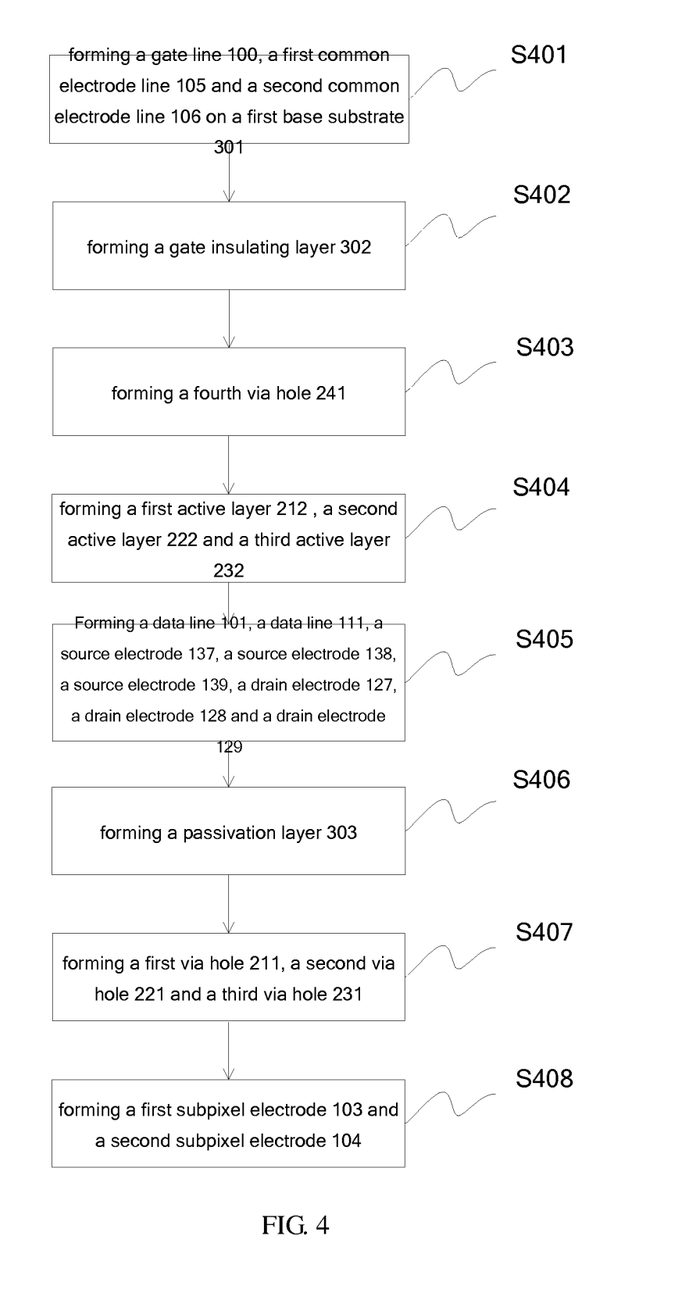
FIG. 4 is a schematic flowchart of a manufacturing method of an array substrate provided by an embodiment of the disclosure.

With reference to FIG. 4, the manufacturing method of the array substrate provided by one embodiment of the disclosure comprises steps of:

S401: forming a gate line 100, a first common electrode line 105 and a second common electrode line 106 on a first base substrate 301 by sputtering and depositing a metal layer, coating a photoresist, exposing, developing and etching; wherein, the gate line 100, the first common electrode line 105 and the second common electrode line 106 can be made of metal materials such as Cu, Al, Mo, Ti, Cr and W, or alloy of above materials; the gate line 100 can be of a single layer structure and can be of a multilayer structure;

S402: forming a gate insulating layer 302 on the gate line 100, the first common electrode line 105 and the second common electrode line 106 by plasma enhanced chemical vapor deposition (PECVD); wherein, the gate insulating layer 302 can be made of materials such as SiC or $SiO_2$; the gate insulating layer 302 can be of a single layer structure and can be of a multilayer structure;

S403: forming a fourth via hole 241 by coating a photoresist, exposing, developing and etching, wherein the second common electrode line 106, in particular, a protruding portion 156 of the second common electrode line, is exposed by the fourth via hole 241;

S404: forming a first active layer 212 of a first thin film transistor 107, a second active layer 222 of a second thin film transistor 108 and a third active layer 232 of the third thin film transistor 109 by depositing a semiconductor layer on the gate insulating layer 302, for example, depositing indium gallium zinc oxide (IGZO) or continuously depositing a-Si and n+a-Si by using PECVD, coating a photoresist, exposing, developing and etching, as shown in FIG. 2; wherein, the first active layer 212, the second active layer 222 and the third active layer 232 can be made of materials such as amorphous silicon, polycrystalline silicon, microcrystalline silicon and oxide semiconductors;

S405: forming a data line 101, a data line 111, a source electrode 137, a source electrode 138, a source electrode 139, a drain electrode 127, a drain electrode 128 and a drain electrode 129 on the active layers 212, 222 and 232 by sputtering and depositing a metal layer, coating a photoresist, exposing, developing and etching, as shown in FIG. 1; wherein, the data line 101, the data line 111, the source electrode 137, the source electrode 138, the source electrode 139, the drain electrode 127, the drain electrode 128 and the drain electrode 129 can be made of metal materials such as Cu, Al, Mo, Ti, Cr and W;

S406: forming a passivation layer 303 on the data line 101 and the data line 111 by depositing, for example, silicon nitride by using PECVD and coating a resin layer; wherein, the passivation layer 303 can be made of inorganic materials such as silicon nitride;

S407: forming a first via hole 211, a second via hole 221 and a third via hole 231 in the passivation layer 303 by coating a photoresist, exposing, developing and etching; wherein, the drain electrode 127 of the first thin film transistor is exposed by the first via hole 211; the drain electrode 128 of the second thin film transistor is exposed by the second via hole 221; and the source electrode 139 of the third thin film transistor is exposed by the third via hole 231;

S408: forming a first subpixel electrode 103 and a second subpixel electrode 104 by sputtering a conductive material layer, coating a photoresist, exposing, developing and etching; wherein, the first subpixel electrode 103 and the second subpixel electrode 104 can be made of transparent metal oxide conductive materials such as indium tin oxide (ITO) and indium zinc oxide (IZO);

Wherein, the gate line 100 is arranged between the first subpixel electrode 103 and the second subpixel electrode 104;

The gate line is electrically connected with the gate electrode of the first thin film transistor 107, the gate electrode of the second thin film transistor 108 and the gate electrode of the third thin film transistor 109, respectively.

For example, with reference to FIG. 1 and FIG. 2, the first thin film transistor 107 includes the gate electrode, the drain electrode 127 and the source electrode 137, wherein, the gate electrode of the first thin film transistor 107 can be a first protruding portion 117 of the gate line 100, the drain electrode 127 of the first thin film transistor 107 is connected with the first subpixel electrode 103 through a first via hole 211, and the source electrode 137 of the first thin film transistor 107 is connected with the data line 101;

The second thin film transistor 108 includes the gate electrode, the drain electrode 128 and the source electrode 138, wherein, the gate electrode of the second thin film transistor 108 can be a second protruding portion 118 of the gate line 100, the drain electrode 128 of the second thin film transistor 108 is connected with the second subpixel electrode 104 through a second via hole 221, and the source electrode 138 of the second thin film transistor 108 is connected with the data line 101 through the source electrode 137 of the first thin film transistor 107;

The third thin film transistor 109 includes the gate electrode, the drain electrode 129 and the source electrode 139, wherein, the gate electrode 119 of the third thin film transistors 109 can be a portion of the gate line 100, the drain electrode 129 of the third thin film transistor 109 is connected with the protruding portion 156 of the second common electrode lines through the fourth via hole 241 and thus connected with the second common electrode line 106, and the source electrode 139 of the third thin film transistor 109 is connected with the first subpixel electrode 103 through the third via hole 231.

The formed array substrate is as shown in FIG. 1 and FIG. 2.

Figure 5:
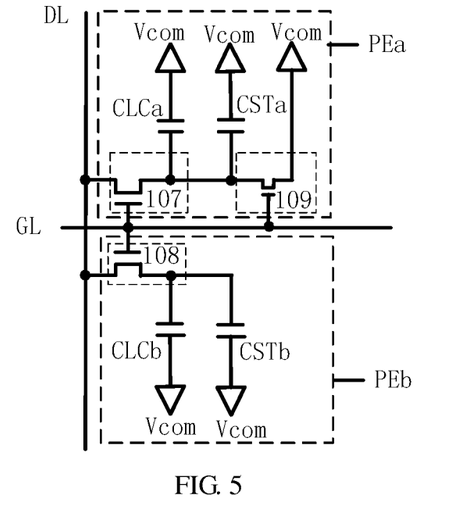
FIG. 5 is a circuit schematic diagram of an array substrate provided by an embodiment of the disclosure.

In addition, FIG. 5 is a circuit schematic diagram of an array substrate provided by an embodiment of the disclosure, wherein, PEa is a first subpixel electrode; PEb is a second subpixel electrode; Vcom is a common voltage, CLCa is a first liquid crystal capacitor, CLCb is a second liquid crystal capacitor, CSTa is a first storage capacitor, and CSTb is a second storage capacitor.

In response to that the gate line (GL) is turned on, the first thin film transistor 107, the second thin film transistor 108 and the third thin film transistor 109 are turned on;

A voltage Vdata applied to the data line (DL) generates a charge current I1 by the first thin film transistor 107 to charge the first storage capacitor CSTa; and the third thin film transistor 109 generates a discharge current I3 to discharge the first storage capacitor CSTa;

A voltage Vdata applied to the data line (DL) generates a charge current I2 by the second thin film transistor 108 to charge the second storage capacitor CSTb.

As the capacitance of the first liquid crystal capacitor CLCa or the second liquid crystal capacitor CLCb is far less than that of the first storage capacitor CSTa or the second storage capacitor CSTb, the liquid crystal capacitor CLCa and the liquid crystal capacitor CLCb are negligible.

As a result, charge Qb on the second storage capacitor CSTb is larger than charge Qa on the first storage capacitor CSTa.

In the case that an electrode area of the first subpixel electrode 103 has is equal to that of the second subpixel electrode 104, the first storage capacitor CSTa is equal to the second storage capacitor. Since the charge Qb on the second storage capacitor CSTb is larger than the charge Qa on the first storage capacitor CSTa, a voltage Vb applied to a second subpixel is greater than a voltage Va applied to a first subpixel;

In the case that an electrode area of the first subpixel electrode 103 has is greater than that of the second subpixel electrode 104, the first storage capacitor CSTa is larger than the second storage capacitor CSTb. As the charge Qb on the second storage capacitor CSTb is larger than the charge Qa on the first storage capacitor CSTa, the voltage Vb of the second subpixel is far greater than the voltage Va of the first subpixel.

Under a general condition, the voltage Va of the first subpixel and the voltage Vb of the second subpixel satisfy a relationship of: 0.6Vb<Va<0.9Vb, so it can be concluded that:

$$0.6(I2)/CSTb<(I1-I3)/CSTa<0.9(I2)/CSTb; \quad \text{Formula I}$$

As I1 is in direct proportion to a channel width to length ratio of the first thin film transistor, I2 is in direct proportion to a channel width to length ratio of the second thin film transistor, and I3 is in direct proportion to a channel width to length ratio of the third thin film transistor, if it is assumed that the channel width to length ratio of the first thin film transistor is w1/l1, the channel width to length ratio of the second thin film transistor is w2/l2 and the channel width to length ratio of the third thin film transistor is w3/l3, then:

$$0.6(w2/l2)/CSTb<(w1/l1-w3/l3)/CSTa<0.9(w2/l2)/CSTb; \quad \text{Formula II}$$

In the case that the electrode area of the first subpixel electrode 103 is equal to that of the second subpixel electrode 104, namely, the first storage capacitor CSTa is equal to the second storage capacitor CSTb, and the channel width to length ratio w1/l1 of the first thin film transistor is equal to the channel width to length ratio w2/l2 of the second thin film transistor, it can be concluded from Formula II that:

$$0.6(w1/l1)<(w1/l1-w3/l3)<0.9(w1/l1) \quad \text{Formula III}$$

It can be concluded by calculating with Formula III that:

$$0.1(w1/l1)<w3/l3<0.4(w1/l1) \quad \text{Formula IV}$$

It can be known from Formula IV that if the first storage capacitor CSTa is equal to the second storage capacitor CSTb, and the channel width to length ratio w1/l1 of the first thin film transistor is equal to the channel width to length ratio w2/l2 of the second thin film transistor, a minimum value of the channel width to length ratio of the third thin film transistor is 0.1 times that of the first thin film transistor.

In the case that the electrode area of the first subpixel electrode 103 has is greater than that of the second subpixel electrode 104, then the first storage capacitor CSTa is larger than the second storage capacitor CSTb.

If it is assumed that the first storage capacitor CSTa is 1.5 times the second storage capacitor CSTb, and the channel width to length ratio w1/l1 of the first thin film transistor is equal to the channel width to length ratio w2/l2 of the second thin film transistor, it can be concluded from Formula II that:

$$w3/l3<0.1(w1/l1) \quad \text{Formula V}$$

It is can be known from Formula V, if the first storage capacitor CSTa is 1.5 times the second storage capacitor CSTb, and the channel width to length ratio w1/l1 of the first thin film transistor is equal to the channel width to length ratio w2/l2 of the second thin film transistor, the minimum value of the channel width to length ratio of the third thin film transistor can be smaller than 0.1 times that of the first thin film transistor.

Under a general condition, the channel width to length ratio of the third thin film transistor 109 is less than that of the first thin film transistor 107, it is can be known from above conclusion that the channel width to length ratio of the third thin film transistor 109 can even be less than 0.1 times that of the first thin film transistor 107.

Therefore, in the array substrate provided by the embodiment of the disclosure the two subpixel electrodes both can be charged by using the same gate line, so the structure of the array substrate can be greatly simplified, and the aperture ratio of the pixel units can be improved.

Figure 6:
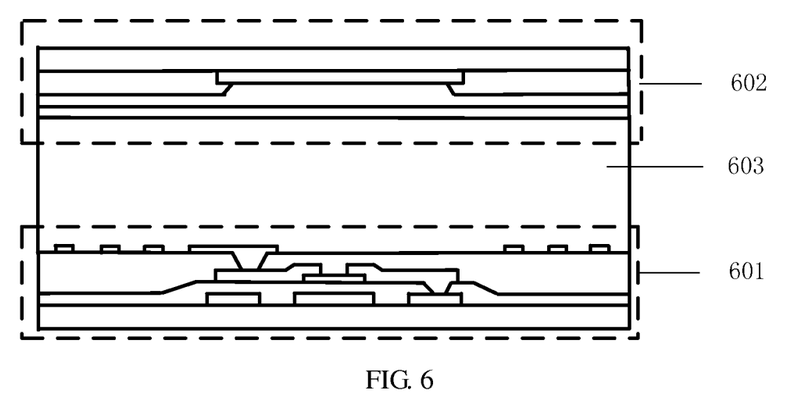
FIG. 6 is a sectional view of a liquid crystal display device provided by an embodiment of the disclosure.

With reference FIG. 6, an embodiment of the disclosure provides a liquid crystal display device, the liquid crystal display device comprising any of the array substrate described above. The liquid crystal display device further comprises:

An opposed substrate 602 opposite to the array substrate 601 and a liquid crystal layer 603 positioned between the array substrate 601 and the opposed substrate 602, wherein, the liquid crystal layer 603 includes a reactive mesogens (RMs), which will be polymerized under irradiation of ultraviolet, so the liquid crystal molecules can obtain specific pretilt angles.

For example, the liquid crystal display device can be a liquid crystal display screen.

Figure 7:
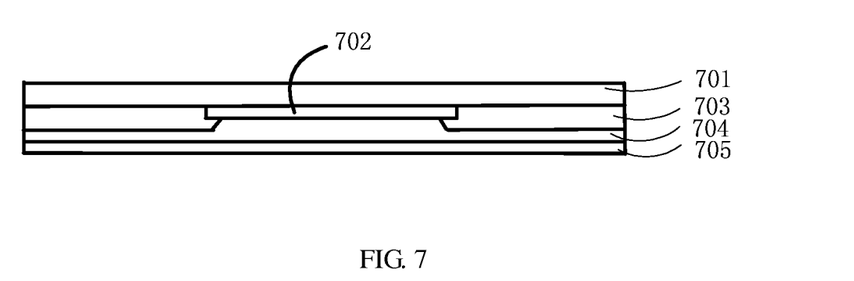
FIG. 7 is a sectional view of a color filter substrate in a liquid crystal display device provided by an embodiment of the disclosure.

With reference to FIG. 7, the opposed substrate 602 in the liquid crystal display device provided by the embodiment of the disclosure can be a color filter substrate, and the color filter substrate can include a base substrate 701, a black matrix 702, a color filter layer 703, a planarization layer 704 and a common electrode layer 705.

The liquid crystal display device can be any product and part with a display function, such as a liquid crystal panel, electronic paper, a liquid crystal television, a digital photo frame, a cellphone, a watch, a tablet computer and a navigator.

To sum up, according to the array substrate and the liquid crystal display device provided by the embodiments of the disclosure, in each pixel unit of the liquid crystal display device in a VA mode, the adjacent subpixel electrodes in the same pixel unit can be charged by using only one gate line therebetween, so the wiring structure of the array substrate is simplified, and the aperture of the pixel unit is improved. In addition, the adjacent subpixel electrodes in the same pixel unit can have different voltages, so the liquid crystal display device can have a wider visual angle.

The foregoing embodiments are only specific embodiments of the disclosure, but the protection scope of the disclosure is not limited by this, in the technical scope disclosed by the disclosure, transformations or substitutions easily thought by any skilled familiar to the art are all covered in the protection scope of the disclosure. Therefore, the protection scope of the disclosure take appended claims as criterion.

The application claims priority of Chinese Patent Application No. 201420585072.2 filed on Oct. 10, 2014, the disclosure of which is incorporated herein by reference in its entirety as part of the present application.

The invention claimed is:

1. An array substrate, comprising a plurality of columns of pixel units defined by adjacent data lines, each column of pixel units including a plurality of pixel units, each pixel unit including subpixel electrodes, common electrode lines and thin film transistors, the subpixel electrodes including a first subpixel electrode and a second subpixel electrode, the common electrode lines including a first common electrode line and a second common electrode line, and the thin film transistors including a first thin film transistor, a second thin film transistor and a third thin film transistor, wherein, each pixel unit further includes:
- a gate line arranged between the first subpixel electrode and the second subpixel electrode, the gate line is electrically connected with a gate electrode of the first thin film transistor, a gate electrode of the second thin film transistor and a gate electrode of the third thin film transistor respectively,
- wherein, a source electrode of the first thin film transistor and a source electrode of the second thin film transistor are both electrically connected with one of the adjacent data lines defining the column of pixel units, and a source electrode of the third thin film transistor is electrically connected with the first subpixel electrode;
- a drain electrode of the first thin film transistor is electrically connected with the first subpixel electrode, a drain electrode of the second thin film transistor is electrically connected with the second subpixel electrode, and a drain electrode of the third thin film transistor is electrically connected with the second common electrode line or the first common electrode line,
- wherein, the drain electrode of the first thin film transistor is connected with the first subpixel electrode through a first via hole, the drain electrode of the second thin film transistor is electrically connected with the second subpixel electrode through a second via hole, and the source electrode of the third thin film transistor is connected with the first subpixel electrode through a third via hole.

2. The array substrate according to claim 1, wherein, the gate line being electrically connected with the gate electrode of the first thin film transistor, the gate electrode of the second thin film transistor and the gate electrode of the third thin film transistor respectively, includes:
- the gate electrode of the first thin film transistor is a first protruding portion of the gate line, the gate electrode of the second thin film transistor is a second protruding portion of the gate line, and the gate electrode of the third thin film transistor is a portion of the gate line.

3. The array substrate according to claim 1, wherein, the source electrode of the second thin film transistor is connected with the one of the adjacent data lines through the source electrode of the first thin film transistor.

4. The array substrate according to claim 1, wherein, the first common electrode line and the second common electrode line are positioned on two sides of the gate line respectively, the first common electrode line is close to the first subpixel electrode and the second common electrode line is close to the second subpixel electrode.

5. The array substrate according to claim 1, wherein, both of the first common electrode line and the second common electrode line include portions parallel with the gate line, and portions parallel with the one of the adjacent data line;
- the first common electrode line and the first subpixel electrode partially or totally overlap, and a first storage capacitor is formed by an overlapping portion of the first common electrode line and the first subpixel electrode; the second common electrode line and the second subpixel electrode partially or totally overlap, and a second storage capacitor is formed by an overlapping portion of the second common electrode line and the second subpixel electrode.

6. The array substrate according to claim 5, wherein, the first common electrode line and/or the second common electrode line further include(s) protruding portions.

7. The array substrate according to claim 6, wherein, the drain electrode of the third thin film transistor is connected with the protruding portion of the second common electrode line through a fourth via hole, and is further connected with the second common electrode line.

8. The array substrate according to claim 1, wherein, each of the first subpixel electrode and the second subpixel electrode includes: a root parallel with the gate line, another root parallel with the one of the adjacent data lines, branch portions and slits corresponding to the branch portions.

9. The array substrate according to claim 1, wherein, a channel width to length ratio of the third thin film transistor is less than that of the first thin film transistor.

10. The array substrate according to claim 1, wherein, a channel width to length ratio of the second thin film transistor is equal to that of the first thin film transistor.

11. The array substrate according to claim 5, wherein, an area of the first subpixel electrode is greater than or equal to that of the second subpixel electrode.

12. The array substrate according to claim 11, wherein, a maximum value of the area of the first subpixel electrode is 1.5 times that of the second subpixel electrode.

13. The array substrate according to claim 1, further comprising a first base substrate, a gate insulating layer and a passivation layer.

14. A liquid crystal display device, comprising an array substrate, an opposed substrate and a liquid crystal layer positioned between the array substrate and the opposed substrate, wherein, the array substrate is the array substrate according to claim 1.

15. The liquid crystal display device according to claim 14, wherein, the opposed substrate is a color filter substrate.

* * * * *